(12) United States Patent
Seely et al.

(10) Patent No.: US 6,300,835 B1
(45) Date of Patent: Oct. 9, 2001

(54) POWER AMPLIFIER CORE

(75) Inventors: Warren L. Seely, Chandler; Ronald F. Kielmeyer; Michael L. Fraser, both of Tempe, all of AZ (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/458,286

(22) Filed: Dec. 10, 1999

(51) Int. Cl.[7] ................................. H03F 3/16; H03F 3/68; H03F 3/04
(52) U.S. Cl. ........................ 330/277; 330/295; 330/296; 330/124 R
(58) Field of Search .................................. 330/277, 295, 330/296, 124 R

(56) References Cited

U.S. PATENT DOCUMENTS

| | | | |
|---|---|---|---|
| 3,603,892 | * | 9/1971 | Paine ..................... 330/295 |
| 4,496,909 | * | 1/1985 | Knapp ..................... 330/277 |
| 5,324,682 | | 6/1994 | Tserng . |
| 5,504,353 | | 4/1996 | Kuzuhara . |
| 5,568,086 | | 10/1996 | Schuss et al. . |
| 5,659,267 | | 8/1997 | Buer et al. . |
| 5,689,212 | | 11/1997 | Floriot et al. . |
| 5,694,498 | | 12/1997 | Manasson et al. . |
| 5,712,593 | | 1/1998 | Buer et al. . |
| 5,739,723 | | 4/1998 | Sigmon et al. . |
| 5,834,975 | | 11/1998 | Bartlett et al. . |
| 5,859,567 | | 1/1999 | Black . |
| 5,874,860 | | 2/1999 | Brunel et al. . |
| 5,880,633 | | 3/1999 | Leizerovich et al. . |
| 5,952,886 | | 9/1999 | Buer et al. . |

* cited by examiner

Primary Examiner—Robert Pascal
Assistant Examiner—Patricia T. Nguyen
(74) Attorney, Agent, or Firm—Timothy J. Lorenz; Frank J. Bogacz

(57) ABSTRACT

A power amplifier core (40) for amplifying RF signals is provided. The power amplifier core (40) includes a first string of FET cells (46) for amplifying the RF signal. The FET cell string includes at least two FET cells (46) connected in series with an output port (48) of the amplifier core. A bias network (44) coupled between an amplifier core input port (42) and the FET cells (46) couples the RF signal to the FET cells (46). The bias network (44) includes a bias capacitor (50) and a resistor network. The bias capacitor (50) is coupled to the input port (42) for AC coupling the RF signal to an associated FET cell (46) in the FET cell string. The resistor network is coupled from the bias capacitor (50) to the associated FET cell (46) for providing a DC bias to the associated FET cell (46).

16 Claims, 4 Drawing Sheets

FIG. 1A —PRIOR ART—

POWER AMPLIFIER CORE

BACKGROUND OF THE INVENTION

1. Field of the Invention

The present invention relates generally to power amplifiers and more particularly to Microwave Monolithic Integrated Circuits that employ Field Effect Transistors in power amplifiers.

2. Background of the Invention

Power amplifiers are widely found in various telecommunications systems, where they are typically employed to amplify a RF signal prior to transmitting the signal from an antenna. The power amplifier includes one or more semiconductor devices that are used for amplifying the signal. Conventional systems typically provide an amplified RF signal that has an output voltage that is limited by the maximum voltage capability of the semiconductor devices. Therefore, to increase the power output of the power amplifier the output current is increased. The size of the cabling that connects the power amplifier to the antenna is directly related to the RF signal output current. Larger cabling for larger currents entails increased costs for the cabling, larger connectors, increased cable mast support, and increased volume requirements for running the cable. Therefore, it is desirable to minimize the output current of a power amplifier.

Other design goals in a monolithic microwave integrated circuit (MMIC) power amplifier design include minimizing the supply current and reducing the impedance mismatch between the power amplifier and other system devices. The supply current to a power amplifier is dependent on the power output, the power dissipated, and the supply voltage at which the power amplifier is operated. Increases in the required output power and the power dissipation of the amplifier cause commensurate increases in the DC supply current to the device, resulting in increased line widths for the interconnections between the semiconductor devices and changes to the substrate to accommodate the higher supply currents. The increased line widths decrease the power amplifier power density and lead to increased parasitic capacitance associated with the interconnecting lines. Therefore, it is desirable to minimize the supply current of the power amplifier.

Mismatching between the power amplifier and other system components results in decreased drain efficiency and narrower bandwidth. Typical power amplifiers exhibit about 3 ohms of output channel impedance, which must be combined at several times the output impedance. For example, if 4 FETs are combined, this results in 200 ohms for a 50 ohm combined match. Thus, the transformation ratio is 200/3= 67:1. Therefore, it is desirable to reduce the mismatch between the power amplifier and other system components.

For a more complete understanding of the invention, its objects and advantages, reference may be had to the following specification and to the accompanying drawings.

BRIEF DESCRIPTION OF THE DRAWINGS

FIG. 1A is a block diagram of prior art power amplifier system;

DETAILED DESCRIPTION OF THE PREFERRED EMBODIMENT

FIG. 1A illustrates a typical prior art power amplifier system that amplifies RF signals. An AC-DC converter 20, located within a building, converts line power such as 115 VAC, 60 Hz to 45 VDC. The output of the AC-DC converter 20 is run up to a power amplifier 22 located on the roof of the building. The power amplifier 22 includes a DC-DC converter 24 and a core amplifier 26 in addition to other system components that are well known to those skilled in the art. The DC-DC converter 24 converts the 45 VDC power to a voltage level that is usable by the core amplifier 26. Generally, a voltage in the range of 9 VDC to 15 VDC is provided since the FETs employed in the core amplifier for amplification have a maximum drain-source voltage breakdown within this range.

Figure 1B:
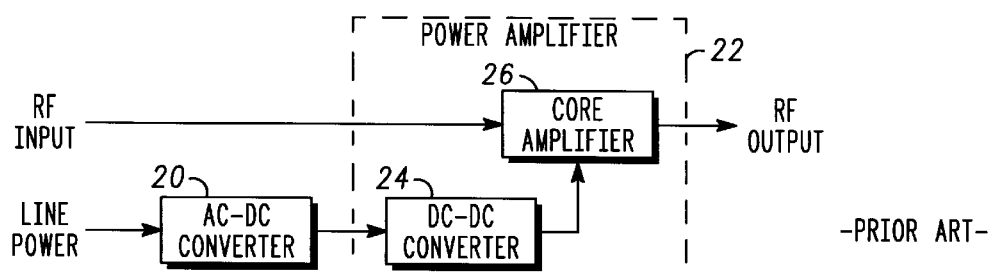
FIG. 1B is a block diagram of a power amplifier system that employs core amplifiers that are in accordance with the principles invention.
Figure 1B:
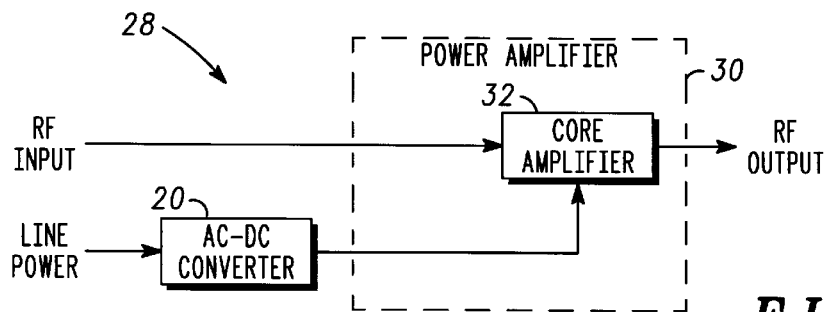

Referring to FIG. 1B, a power amplifier system 28 employing a core amplifier 32 in accordance with the principles of the invention is illustrated. The power amplifier system 28 is different than the prior art system in that the output of the AC-DC converter 20 is coupled to the core amplifier, a DC-DC converter is not required. The core amplifier 32 of the presently preferred embodiment is capable of operating with an operating voltage level that is greater than prior art systems. Eliminating the DC-DC converter 24 from the power amplifier system 28 improves the system power efficiency, reduces the system volume, and reduces system cost.

Figure 2:
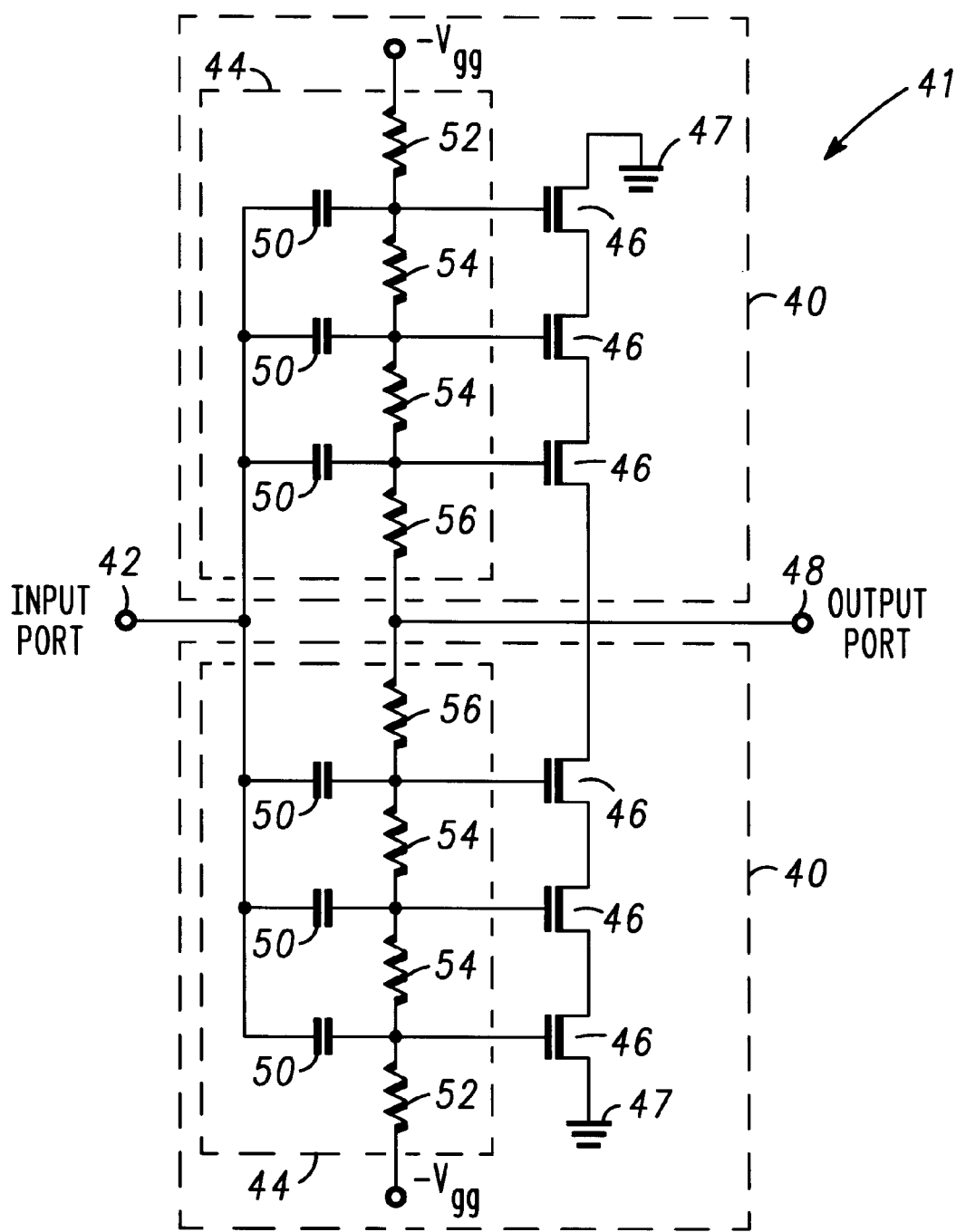
FIG. 2 is a detailed schematic of the presently preferred embodiment of the present invention.

Referring to FIG. 2 an N-tier, M-parallel power core 41 in accordance with the teachings of the present invention is shown. The preferred embodiment is a 3-tier, 2-parallel power core. The M-parallel power core 41 includes two parallel amplifier cores 40 that provide amplification of an RF signal that is coupled through an input port 42. Although only two amplifier cores 40 are coupled in parallel in the presently preferred embodiment, the principles of the invention may be readily extended to coupling more than two amplifier cores 40 in parallel. In the preferred embodiment the RF signal is in the range of 26 GHz to 31 GHz, however it is within the scope of the invention for the RF signal to be within the range of 600 MHz to 50 GHz. A PHEMT process using a 4 mil GaAs substrate is employed for constructing the presently preferred embodiment. However, the principles of the invention are not limited by the process nor substrate material that is employed for constructing the device. Each of the amplifier cores 40 includes a bias network 44 coupled between the input port 42 and a string of three FET cells 46. Although, the preferred embodiment of the invention employs three FET cells 46 in series, it is envisioned that two or more FET cells may be coupled in series. The FET cells 46 extend from a single ground point 47 to an output port 48. Only requiring a ground point 47 at each end of the M-parallel power core 41 improves performance because core size is not limited due to phasing problems associated with the channel side. The bias network 44 AC couples the RF signal to each of the FET cells 46. The amplified RF signal is coupled from each of the amplifier cores 40 to the single output port 48. Phasing problems normally associated with output ports are minimized due to the single output port 48 employed in the preferred embodiment.

The bias network 44 includes a string of resistors that provide a DC bias point for each of the FET cells 46. The string of resistors includes an upper resistor 56, two bias resistors 54, and a lower resistor 52. The string of resistors is selected so that a DC bias, Vgs, of −0.2 volts is provided to the gate-source junction of each FET cell 46 in the string of FET cells. In addition, the values for the string of resistors are selected so that the impedance of the resistor string does not load down the gate-source of the FET cells 46. However, an upper limit for the values of the resistors in the resistor string is imposed by the desirability of limiting the physical size of the resistors. In the preferred embodiment, the real part of the input impedance at the RF operating frequency for each FET cell is approximately 10 to 15 ohms. Therefore, the value of the bias resistor 54 is selected to be preferably in the range of 5 k ohms to 15 k ohms with a preferred value of 10 k ohms. The values for the upper and lower resistors 52 and 56 are selected based upon the value of the bias resistors 54. The optimum values of the lower resistor 52 and upper resistor 56 are determined from the following equations:

$$Rlower = Rbias + Vgs*(N+1)*Rbias/(Vdd-Vgg)$$

$$Rupper = Rbias - Vgs*(N+1)*Rbias/(Vdd-Vgg)$$

$$Set: Vgg = -1*Vdd/N$$

Where Vgs is the desired DC voltage to be applied to the FET gate-source junction, N is the number of FET cells 46 in the string, Vdd is the voltage at the output port, and Vgg is the voltage applied to the lower resistor 52. In the preferred embodiment, N is 3, Vdd is 15 volts, and Vgg is set to −5 volts. The resulting optimum values for the upper and lower resistors 56 and 52 are 10.4 k ohms and 9.6 k ohms. The values for the upper and lower resistors 56 and 52 are preferably selected to be the calculated optimum values, however it is within the scope of the invention to select values that vary from the optimum values by more than 30%. Selecting non-optimum values for the upper and lower resistors 56 and 52 will result in an uneven DC bias being applied to the string of FET cells 46. As the error in the DC bias increases, hot spots develop in the junctions of the FET cells 46 potentially leading to destruction of the FET cells 46. At increasing output power levels, the hot spots develop with less error in the DC bias applied to the FET cells. Therefore, at low output power levels it is possible to operate the invention with significant DC bias error without developing destructive hot spots.

The bias network 44 also includes a bias capacitor 50 corresponding to each of the FET cells 46. The bias capacitor 50 filters out the DC component of the RF signal and couples the resulting AC component to the string of resistors and the corresponding FET cell 46. The value of the bias capacitor 50 is preferably selected to be approximately 2 ohms reactance at the lowest transmitting frequency. However, a wide range of values may be used for the bias capacitor 50. The upper limit on the capacitance value is set by the desirability of limiting the physical size of the bias capacitor 50. Larger values of capacitance require a larger surface area for the plates of the capacitor 50. The lower limit on the capacitance value is limited by the amount of attenuation of the RF signal that is acceptable. In the preferred embodiment, the RF signal is attenuated less than 0.5 db. However, it is within the scope of the invention to select values of capacitance for the bias capacitor that result in higher values of attenuation, dependent on the design mismatch requirements for obtaining desired amplitude and phase goals.

Figure 3:
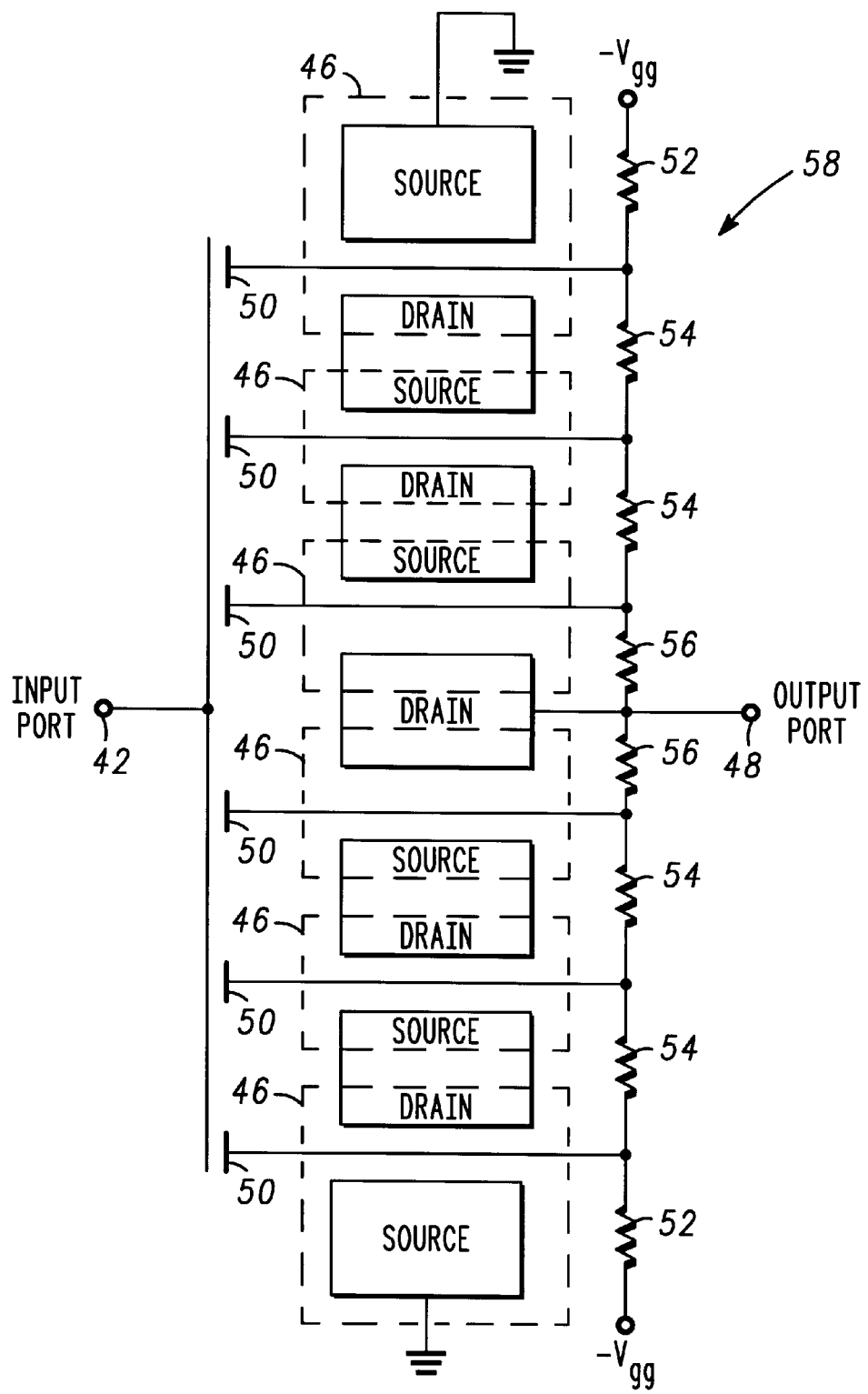
FIG. 3 is a core layout diagram of the presently preferred embodiment of the present invention.

Referring to FIG. 3, a core layout 58 of the preferred embodiment of the M-parallel power core 41 is illustrated. Those skilled in the art will recognize the core layout 58 as being in a form ready for entry into a Cadence computer system. The RF input signal is coupled through the input port 42 to the bias capacitors 50 that correspond to each of the FET cells 46. Each of the bias capacitors 50 connect to the gate of the corresponding FET cell 46 and to a resistor string comprising an upper resistor 56, a lower resistor 52, and two bias resistors 54. The amplified RF signal is coupled from the FET cells 46 to the output port 48.

Again referring to FIG. 2, the operation of the preferred embodiment is as follows. A DC bias is applied to each of the FET cells 46 by dividing the output voltage across the resistor string comprising the upper resistor 56, the two bias resistors 54 and the lower resistor 52. The DC bias applied to each FET cell 46 is such that the operating point of each of the FET cells 46 is set to approximately the same value. An RF signal that is input to the input port 42 is AC coupled through each of the bias capacitors 50 in both amplifier cores 40. The resulting AC component of the RF signal is then added to the DC bias provided by the resistor string, and the biased RF signal is then applied to the FET cell 46 corresponding to the bias capacitor 50. Since, each of the FET cells 46 in the string of FET cells is set to the same operating point, they are turned-on to approximately the same degree, causing current to flow through the string of FET cells 46. In addition, the load voltage at the output port 48 divides approximately equally across each of the FET cells 46. The power dissipated across each of the FET cells 46 is approximately equal since a common current flows through each of the FET cells 46 and the drain-source voltage of each of the FET cells 46 is approximately equal. The current flows from the output port 48 through the FET cells 46 of each of the amplifier cores 40 to the corresponding ground points 47.

By connecting the FET cells 46 in series and providing a means of dividing the drain-source voltage approximately equally across each FET cell 46, an operating voltage of about N times (where N is the number of FET cells that are connected in series) the conventional operating voltage can be sustained. Using a higher operating voltage leads to a proportional decrease in the FET cell channel current for power cores having the same power output. The lower channel current permits the use of proportionally smaller line widths for the traces that connect the FET cells 46. The reduction in line widths permits denser packaging of the amplifier core and reduces the parasitic capacitance associated with the traces. Additionally, the real channel impedance increases by a factor of $N^2$ as the operating voltage increases by a factor of N and the channel current decreases by a factor of N. Also, the parasitic output capacitance of each power amplifier core decreases by a factor of 1/N due to stacking the FET cells, thereby minimizing phase matching problems associated with the output of the M-parallel power core 41.

Figure 4:
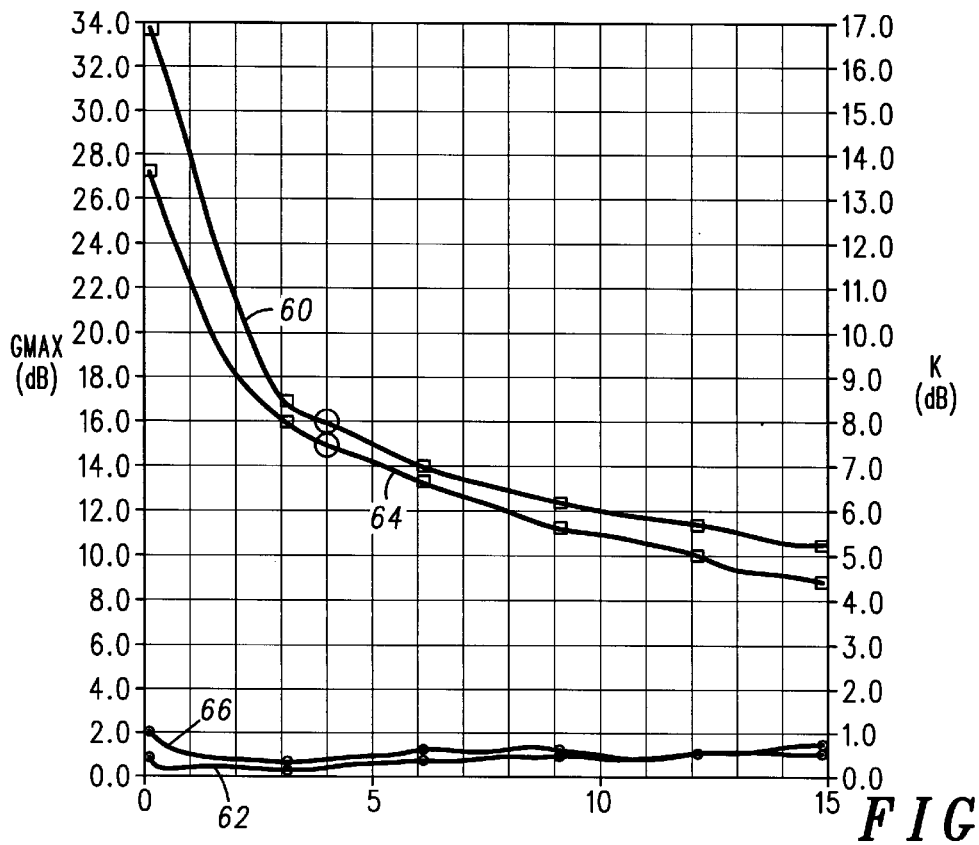
FIG. 4 illustrates the difference in gain characteristics of the presently preferred embodiment of the invention and a standard FET.

Referring to FIG. 4, a graph illustrating the small signal gain and stability characteristics of the presently preferred embodiment in relation to a conventionally configured power core are shown. The conventional power core employs 6 FET cells connected in parallel, whereas the preferred embodiment is a dual three tier FET cell configuration. The conventional power core gain characteristic 60 slowly decreases from 22 db at 1 GHz to 10.5 db at 15 GHz. The gain characteristic 64 of the presently preferred embodiment is approximately 1.5 db less than the convention power core gain throughout the frequency range extending from 1 GHz to 15 GHz. Although there is a slight decrease in small signal gain, comparing the presently preferred embodiment stability characteristic 66 to the conventional power core stability characteristic 62 illustrates the increased stability of the preferred embodiment.

Figure 5:
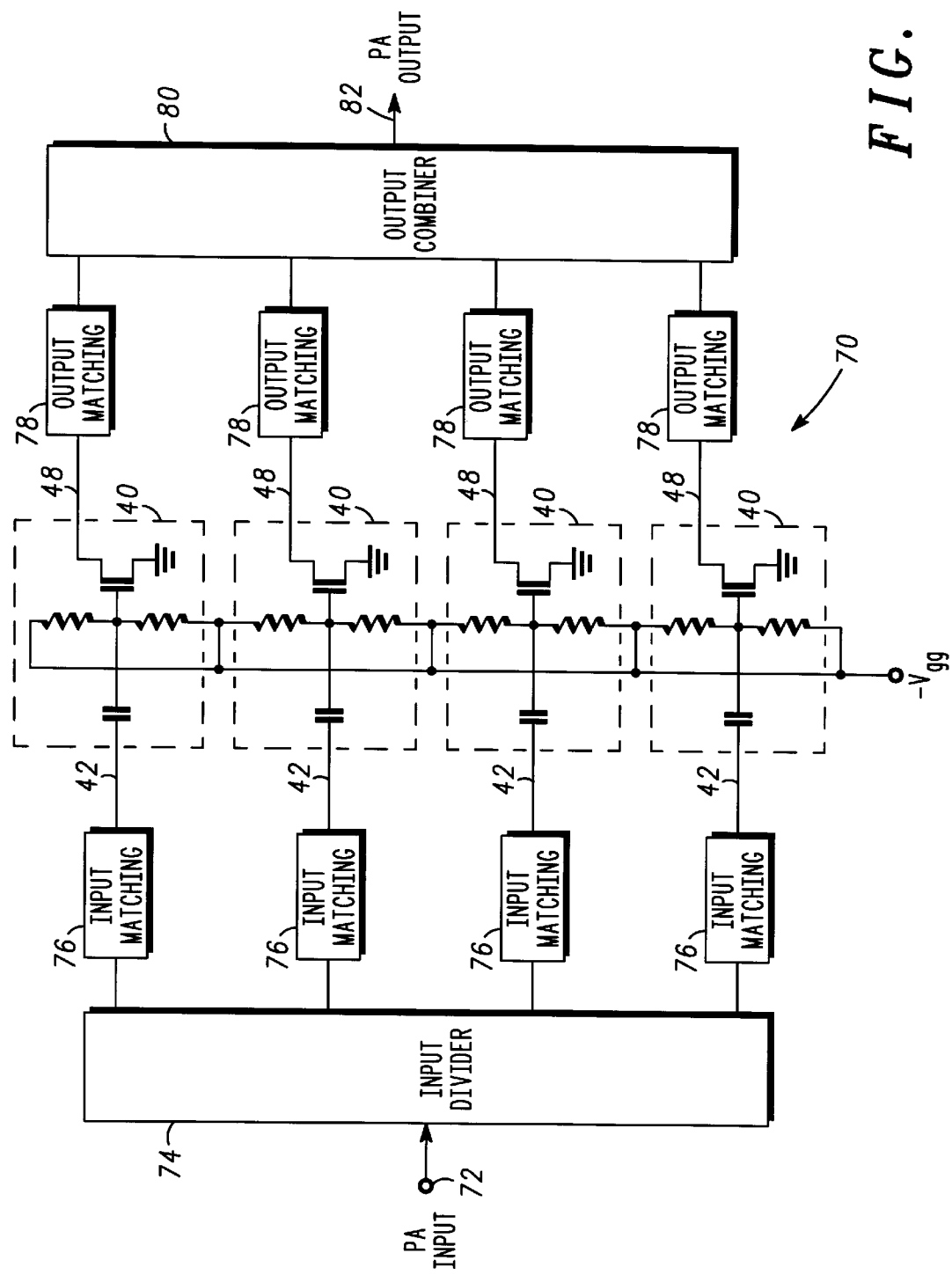
FIG. 5 is a block diagram of a power amplifier circuit that employs core amplifiers that are in accordance with the principles invention.

FIG. 5 illustrates a power amplifier 70 that includes a M-parallel power core 41 in accordance with the teachings of the invention. A PA input 72 to the power amplifier 70 couples an RF signal to an input divider 74. The input divider 74 divides the RF signal into six RF input signals that are coupled to the inputs of corresponding input matching circuits 76. The outputs of the input matching circuits 76 are connected to the input ports 42 of four corresponding power cores 41. Although, separate input matching circuits 76 are used in the embodiment, it is within the scope of the invention to use well known design techniques to combine each input matching circuit 76 with the bias network of the associated power core 41. Dual 3-tier power cores are employed for the embodiment, however the principles of the invention may be extended to other power core configurations such as dual 5-tier power cores. Each of the power cores 41 amplifies the corresponding RF input signal. The amplified RF signals are then combined through output matching circuits 78 and an output combinor 80. The resulting PA output 82 is coupled to the power amplifier load (not shown).

The power amplifier 70 provides a means of combining multiple power cores 41 to provide a scalable amplification level for the RF signal. The increased impedance of the power cores 41 provides increased drain efficiency and bandwidth due to the improved impedance matching of the power core outputs. Additionally, the decrease in operating current caused by using a higher operating voltage, leads to a reduction in the size of the interconnecting cable and associated components between the power amplifier and the DC supply.

Thus it will be appreciated from the above that as a result of the present invention, a core amplifier is provided by which the principal objectives, among others, are completely fulfilled. It will be equally apparent and is contemplated that modification and/or changes may be made in the illustrated embodiment without departure from the invention. Accordingly, it is expressly intended that the foregoing description and accompanying drawings are illustrative of preferred embodiments only, not limiting, and that the true spirit and scope of the present invention will be determined by reference to the appended claims and their legal equivalent.

What is claimed is:

1. A power amplifier core having an input port and an output port for amplifying an RF signal, comprising:
    a first FET cell string for amplifying the RF signal, comprising at least two FET cells connected in series with the output port;
    a bias network coupled between the input port and the at least two FET cells for coupling the RF signal to the at least two FET cells, wherein the bias network provides a DC bias to the at least two FET cells and AC couples the RF signal to the at least two FET cells provided the DC biased such that the first FET cell string amplifies the RF signal;
    the bias network including:
        a bias capacitor coupled to the input port for AC coupling the RF signal to an associated FET cell;
        a resistor network coupled from the bias capacitor to the associated FET cell for providing the DC bias to the associated FET cell, wherein the DC bias is selected such that the associated FET cell amplifies the RF signal coupled through the bias capacitor; and
        the resistor network including an upper resistor connected from the output port to a bias resistor string and a lower resistor connected from the bias resistor string to a bias voltage port, the bias resistor string including a bias resistor associated with each of the at least two FET cells.

2. The power amplifier core of claim 1 wherein the bias network is selected such that each of the at least two FET cells amplifies the RF signal by substantially the same amount.

3. The power amplifier core of claim 1 wherein each of the at least two FET cells has an input impedance and the resistor network has an output impedance that is selected such that the resistor network decreases the input impedance of the associated FET cell by less than 10 percent.

4. The power amplifier core of claim 1 further having a lowest transmitting frequency wherein capacitance of the bias capacitor is selected such that reactance of the bias capacitor at a lowest transmitting frequency is in a range of 0.2 to 20 ohms.

5. The power amplifier core of claim 1 wherein capacitance of the bias capacitor is selected such that reactance of the bias capacitor at a lowest transmitting frequency is preferably about 2 ohms.

6. The power amplifier core of claim 1 further including a second FET cell string connected in parallel with the first FET cell string.

7. The power amplifier core of claim 1 further having a lowest transmitting frequency, the power amplifier core further including:
    a second FET cell string connected in parallel with the first FET cell string;
        wherein capacitance of the bias capacitor is selected such that reactance of the bias capacitor at the lowest transmitting frequency is in a range of 0.2 to 20 ohms; and
        wherein each of the at least two FET cells has an input impedance and the resistor network has an output impedance that is selected such that the resistor network decreases the input impedance of the associated FET cell by less than 10 percent.

8. A power amplifier core having an input port and an output port for amplifying an RF signal, comprising:
    at least two FET cell strings coupled in parallel for amplifying the RF signal, each of said at least two FET cell strings including;
        at least two FET cells connected in series with the output port, and
        a bias network coupled between the input port and the at least two FET cells for coupling the RF signal to the at least two FET cells, the bias network including;
            a bias capacitor coupled to the input port for AC coupling the RF signal to an associated FET cell, and
            a resistor network coupled from the bias capacitor to the associated FET cell for providing a DC bias to the associated FET cell, wherein the DC bias is selected such that the associated FET cell amplifies the RF signal coupled through the bias capacitor.

9. The power amplifier core of claim 8 wherein the bias network is selected such that each of the at least two FET cells amplifies the RF signal by substantially the same amount.

10. The power amplifier core of claim 8 further having a lowest transmitting frequency:

wherein capacitance of the bias capacitor is selected such that reactance of the bias capacitor at the lowest transmitting frequency is in a range of 0.2 to 20 ohms; and wherein each of the at least two FET cells has an input impedance and the resistor network has an output impedance that is selected such that the resistor network decreases the input impedance of the associated FET cell by less than 10 percent.

11. A power amplifier for amplifying an RF signal, comprising:

at least one core amplifier having an input port and an output port for amplifying the RF signal, including;

at least one FET cell string for amplifying the RF signal, said at least one FET cell string comprising at least two FET cells connected in series with the output port; and a bias network coupled between the input port and the at least two FET cells for coupling the RF signal to the at least two FET cells, the bias network including;

a bias capacitor coupled to the input port for AC coupling the RF signal to an associated FET cell; and a resistor network coupled from the bias capacitor to the associated FET cell for providing a DC bias to the associated FET cell, wherein the DC bias is selected such that the associated FET cell amplifies the RF signal coupled through the bias capacitor;

an input divider for providing the RF signal in phase to said at least one core amplifier; and an output combiner for combining the outputs of said at least one core amplifier.

12. The power amplifier of claim 11 wherein the power amplifier further comprises:

an input matching circuit coupled to the input divider; and an output matching network coupled from the output port to the output combiner.

13. The power amplifier of claim 12 wherein the bias network is selected such that each of the at least two FET cells amplifies the RF signal by substantially the same amount.

14. The power amplifier of claim 12 wherein each of the at least two FET cells has an input impedance and the resistor network has an output impedance that is selected such that the resistor network decreases the input impedance of the associated FET cell by less than 10 percent.

15. The power amplifier of claim 12 wherein the resistor network includes an upper resistor connected from the output port to a bias resistor string and a lower resistor connected from the bias resistor string to a bias voltage port, the bias resistor string including a bias resistor associated with each of said at least two FET cells; and the power amplifier has a lowest transmitting frequency wherein capacitance of the bias capacitor is selected such that reactance of the bias capacitor at a lowest transmitting frequency is in a range of 0.2 to 20 ohms.

16. The power amplifier of claim 12 further having a lowest transmitting frequency wherein capacitance of the bias capacitor is selected such that reactance of the bias capacitor at a lowest transmitting frequency is in a range of 0.2 to 20 ohms.

\* \* \* \* \*